United States Patent [19]

Terada

[11] Patent Number: 5,253,210
[45] Date of Patent: Oct. 12, 1993

[54] PARTITIONED BIT LINE STRUCTURE OF EEPROM AND METHOD OF READING DATA THEREFROM

[75] Inventor: Yasushi Terada, Hyogo, Japan

[73] Assignee: Mitsubishi Denki Kabushiki Kaisha, Tokyo, Japan

[21] Appl. No.: 679,301

[22] Filed: Apr. 2, 1991

[30] Foreign Application Priority Data

Apr. 4, 1990 [JP] Japan .................................. 2-90924

[51] Int. Cl.$^5$ .............................................. G11C 11/40
[52] U.S. Cl. ...................................... 365/207; 365/203
[58] Field of Search .................. 307/530; 365/189.11, 365/203, 207, 210

[56] References Cited

U.S. PATENT DOCUMENTS 4,112,508 9/1978 Itoh .................................. 365/203 X

FOREIGN PATENT DOCUMENTS 6173305 9/1984 Japan .
62-170097 1/1986 Japan .

OTHER PUBLICATIONS

Masanobu Yoshida et al., "An 80ns Address-Date Multiplex 1Mb CMOS EPROM", 1987 IEEE International Solid-State Circuits Conference, Feb. 25, 1987, pp. 70–71.
Kenichi Imamiya et al., "A 68ns 4Mbit CMOS EPROM with high noise immunity design", 1989 Symposium on VLSI Circuits, May, 1989, pp. 37–38.
Kazuo Kobayashi et al., "A Self-Timed Dynamic Sensing Scheme for 5V Only Multi-Mb Flash E$^2$ PROMs", 1989 Symposium on VLSI Circuits, May, 1989, pp. 39–40.

*Primary Examiner*—Steven Mottola
*Attorney, Agent, or Firm*—Lowe, Price, LeBlanc & Becker

[57] ABSTRACT

A memory cell array is electrically separated into an upper memory cell array 1a and a lower memory cell array 1b by a connection transistor group 2, when an external address signal changes. Therefore, each bit line pair in the memory cell array is separated into corresponding two bit line pairs. The potential of the bit line belonging to the selected memory cell is set to the read potential. Meanwhile, the potential of the bit line forming the pair of the bit line separated from the bit line is set to an intermediate potential between "0" read potential and "1" read potential. Then, the upper memory cell array 1a and the lower memory cell array 1b are electrically connected, whereby the bit line pairs corresponding to each memory cell array are integrated into one bit line pair. The potential difference of the two bit lines forming the integrated bit line pair is amplified by a corresponding differential amplifying type sense amplifier. As a result, the information read out from the selected memory cell is sensed.

20 Claims, 10 Drawing Sheets

OPEN BIT LINE ARCHITECTURE

PARTITIONED BIT LINE STRUCTURE OF EEPROM AND METHOD OF READING DATA THEREFROM

BACKGROUND OF THE INVENTION

1. Field of the Invention

The invention generally relates to semiconductor memory devices, and more particularly, to a semiconductor memory device applicable to a non-volatile semiconductor memory device.

2. Description of the Background Art

FIG. 1 is a block diagram showing the whole structure of a conventional all-cells-at-one-time erasing type of an erasable and programmable read only memory (hereinafter referred to as flash EEPROM).

Referring to FIG. 1, the flash EEPROM comprises a plurality of memory cell arrays 31. Each memory cell array 31 is provided with a column decoder-Y gate 32. There is also a row decoder 33 common to the plurality of memory cell arrays 31. The plurality of column decoder-Y gates 32 have a column address signal applied from a Y address buffer 34. A row address signal is applied to row decoder 33 from an X address buffer 35. A sense amplifier-write driver 36 is connected to each column decoder-Y gate 32 via an input/output line I/O. An input/output buffer 37 is commonly connected to the plurality of sense amplifier/write drivers 36.

External chip enable signal $\overline{CE}$, write enable signal $\overline{WE}$, and output enable signal $\overline{OE}$ are applied to a control signal input buffer 38. The control signal input buffer 38 applies a control signal to a read/write timing generating circuit 39 in response to these signals. The read/write timing generating circuit 39 generates various timing signals in response to the control signal for controlling read/write operation.

Each memory cell array 31 comprises a plurality of memory cells arranged in a matrix manner which is described later. The row decoder 33 selects one row of memory cell array 31 in response to a row address signal applied from X address buffer 35. The column decoder-Y gate 32 selects one column of memory cell array 31 in response to a column address signal applied from Y address buffer 34. Data is read out from the memory cell provided at the intersection of these selected rows and columns to be amplified by a sense amplifier in sense amplifier-write driver 36, and provided via an input/output buffer 37.

FIG. 2 is a circuit diagram showing the structure of one memory cell array 31 included in the flash EEPROM of FIG. 1.

As shown in FIG. 2, a plurality of memory cells MC are arranged in a matrix within memory cell array 31. Bit line BL is connected to each column of the plurality of memory cells MC. The drain of each memory cell MC is connected to the bit line BL. Each bit line BL is connected to the input/output line I/O via the N channel MOS transistor Q31. A plurality of transistors Q31 form the Y gate included in the column decoder-Y gate 32 of FIG. 1. A column decoder 32a included in column decoder-Y gate 32 is connected to the gate of each transistor Q31. A word line WL is provided in each row of the plurality of memory cells MC. The control gate of memory cell MC is connected to each word line WL. The plurality of word lines WL are connected to row decoder 33. The sources of all memory cells MC are connected to ground via source line SL and N channel MOS transistor Q32. An erase signal $\overline{ERS}$ is applied to the gate of transistor Q32. A current detecting type sense amplifier 40 included in sense amplifier-write driver 36 is connected to input/output line I/O.

FIG. 3 is a sectional view of memory cell MC, while FIG. 4 shows an equivalent circuit of memory cell MC.

Referring to FIG. 3, a source 41 and a drain 42 constituted by N+ diffusion layer are formed on a P type semiconductor substrate 40. A control gate 44 is provided above the channel region between source 41 and drain 42, with an insulated floating gate 43 between control gate 44 and the channel region. A thin tunnel oxide film 45 of approximately 100Å is formed between floating gate 43 and drain 42. As shown in the equivalent circuit diagram of FIG. 4, memory cell MC is equivalently a memory cell transistor 46 with a variable threshold voltage.

In the memory cell transistor 46, data "1" or "0" is stored depending on whether electrons are stored in floating gate 43 or not. The writing (program) of memory transistor 46 is executed by injecting hot electrons to floating gate 43. When electrons are injected in floating gate 43, the threshold voltage of memory transistor 46 becomes high. This causes the channel region between source 41 and drain 42 to become non-conductive when a predetermined voltage is applied to control gate 44. On the contrary, when electrons are extracted from floating gate 43, the threshold voltage of memory transistor 46 becomes low. This causes the channel region between source 41 and drain 42 to become conductive when a predetermined voltage is applied to control gate 44. By making the positive and negative threshold voltages correspond to data "1" and "0", a non volatile storage is implemented.

The erase, write, and read operation of the flash EEPROM of FIG. 2 will be described.

In the erase operation, high voltage Vpp is applied to all bit lines BL, and all word lines WL are connected to ground, as shown in FIG. 5. At this time, erase signal $\overline{ERS}$ is brought to the "L" level so that transistor Q32 becomes non-conductive, to hold source line SL at a floating state. Accordingly, the electrons stored in floating gate 43 of the memory transistor are pulled by drain 42 due to tunnel phenomenon, as shown in FIG. 6. As a result, the threshold voltage of the memory transistor becomes low. Thus, the erase of data stored in all memory cells MC is carried out at one time.

In write operation, a high voltage Vpp is applied to the selected bit line BL and the selected word line WL, as shown in FIG. 7. At this time, erase signal $\overline{ERS}$ is high. As a result, transistor Q32 is turned on, and source line SL is connected to ground. This causes avalanche breakdown in the vicinity of drain 42 of the memory transistor, so that hot electrons are injected to floating gate 43, as shown in FIG. 8. Therefore, the threshold voltage of the memory transistor becomes high. Thus, data is written into the memory cell enclosed with the broken line in FIG. 7.

The read operation of the flash EEPROM will be described. Referring to FIG. 2, one of the plurality of word lines WL is selected by row decoder 33, to which a potential of "H" level is applied. One of the plurality of transistors Q31 is selected by column decoder 32a, to which a potential of "H" is applied to the gate thereof. Thus, one memory cell MC is selected in the above manner. A current detecting type sense amplifier 40 connected to input/output line I/O detects whether current flows from the drain to the source of the selected memory cell MC or not.

Current will not flow through the unselected memory cells MC having a low threshold voltage, because a potential of the "L" level is applied to the control gate of the unselected memory cell MC.

FIG. 9 shows the circuit diagram of the current detecting type sense amplifier 40 of FIG. 2. This current detecting type sense amplifier 40 is shown in Japanese Patent Laying-Open No. 62-170097, for example.

The sense amplifier 40 comprises a current-voltage conversion circuit 40a for converting the current corresponding to the data stored in memory cell MC into voltage, and an inverting circuit 40b for inverting the converted voltage signal. The current-voltage conversion circuit 40a comprises P channel MOS transistors Q41, Q42, and N channel MOS transistors Q43, Q44, and Q45.

In read operation, when memory cell MC turns to a conductive state, the potential of node N11 becomes approximately 1.0V at a steady state. This causes transistor Q43 to be turned on slightly and the potential of node N12 becomes approximately 2V. Consequently, transistors Q44 and Q45 are turned on slightly. However, the potential of node N13 will attain substantially the same level of the potential of node N11 (i.e 1.0V), because the ON resistance of transistor Q42 is set to be much higher than the ON resistance of transistor Q45.

When the memory cell MC is turned to a non-conductive state in read operation, the potential of node N11 becomes approximately 1.1V. This causes the potential of node N12 to be approximately 1.8V so that the potential difference between the gates and sources of transistors Q44 and Q45 becomes approximately 0.7V. Consequently, transistors Q44 and Q45 are turned off to raise the potential of node N13 to 5V.

Thus the reading of data in a conventional flash EEPROM is performed by sensing whether or not current flows through the selected memory cell. However, in the reading operation, when a high potential is applied to bit line BL, a high electric field is applied to the tunnel oxide film 45, resulting in the problem that electrons stored in floating gate 43 leak away. Therefore, the potential of drain 42 had to be suppressed to approximately 1–2V. For the purpose of sensing the current flowing through the memory cell while suppressing the drain potential, a current detecting type sense amplifier 40 was employed.

The current detecting type sense amplifier 40 has a complicated circuit structure, as shown in FIG. 9. The layout area of the current detecting type sense amplifier 40 is large, resulting in difficulty in arrangement by each bit line. Consequently, a conventional flash EEPROM is implemented with a structure in which the memory cell array is divided into a plurality of blocks with the current detecting type sense amplifier arranged in each block, as shown in FIG. 1. However, this structure has the problem of difficulty in realizing high speed read out mode such as the so-called page read out mode (the mode of reading out the data of all memory cells connected to one word line WL at one time) of a DRAM.

A semiconductor memory device using a differential amplifying circuit is disclosed in Japanese Patent Laying-Open No. 61-73305. The semiconductor memory device has one pair of bit lines 51 and 52 connected to either side of a differential amplifying circuit 59, as shown in FIG. 10A. Bit line 51 has a plurality of memory cells 55A (only one memory cell is shown in the figure) and one dummy cell 58A connected, while bit line 52 has a plurality of memory cells 55B (only one memory cell is shown in the figure) and one dummy cell 58B connected.

At the time of reading, bit lines 51 and 52 are charged to supply potential Vdd. When one of the memory cells 55A connected to bit line 51 is selected, the dummy cell 58B connected to bit line 52 is simultaneously selected. Accordingly, if data "1" is stored in the selected memory cell 55A, the potential of bit line 51 remains at supply potential Vdd. If data "0" is stored in the selected memory cell 55A, the potential of bit line 51 is discharged to ground potential. The conductance of dummy cells 58A and 58B is set to be lower than that of memory cells 55A and 55B storing data "0", and also set to be larger than the conductance of memory cell 55A and 55B storing data "1". Therefore, though the potential of bit line 52 is discharged when dummy cell 58A is selected, the potential change of bit line 52 is slower than the potential change when data "0" is read out to bit line 51. This causes difference in the potentials between bit lines 51 and 52, wherein this potential difference undergoes differential amplifying by a differential amplifying circuit 59.

The differential amplifying circuit 59 can be arranged for each bit line because the circuit structure is relatively simple in comparison with the current detecting type sense amplifier 50 shown in FIG. 9. Therefore, the semiconductor memory device of FIG. 10A does not have the problems seen in the conventional EEPROM of FIGS. 1 and 2.

However, the semiconductor memory device of FIG. 10A has a problem due to the fact that the differential amplifying circuit 59 has to be arranged in the middle of the memory cell array. The differential amplifying circuit 59 is generally connected to the input/output line of data, to which the data input/output pins provided in the periphery of the semiconductor chip must be connected. Therefore, in the case where a semiconductor memory device as shown in FIG. 10A has to have the differential amplifying circuit 59 arranged in the middle of the memory cell array, the input/output line of the data becomes long, leading to the difficulty in the layout for wiring. It is appreciated from FIG. 10B that the semiconductor memory device of FIG. 10A requires differential amplifying circuit 59, as well as column decoder 54, and transfer gates 53A and 53B to be provided for each bit line. However, the pitch between each bit line (the pitch in the vertical direction of FIG. 10B) is liable to become narrow in accordance with increase in integration density. It was therefore difficult to arrange differential amplifying circuit 59, column decoder 54, and transfer gates 53A and 53B in such narrow pitches.

Furthermore, in the semiconductor memory device of FIG. 10A, the conductance of dummy cells 58A and 58B must be set to a half of the conductance of memory cells 55A and 55B. Such parameter settings of dummy cells 58A and 58B are difficult under the manufacturing technology.

Also, bit lines 51 and 52 are precharged to supply potential Vdd (approximately 5V), prior to the reading of data in the semiconductor memory device of FIG. 10A. This means that supply potential Vdd is applied to the drains of memory cells 55A and 55B to increase the potential difference between the floating gate storing electrons and the drain. As a result, electrons are pulled from the floating gate to the drain by tunnel phenomenon causing undesired effect on the data holding characteristics of memory cells 55A and 55B.

SUMMARY OF THE INVENTION

An object of the present invention is to provide a semiconductor memory device that can implement a sense amplifier with a simple circuit structure.

Another object of the present invention is to provide a semiconductor memory device with improved flexibility in the layout of sense amplifiers and wirings associated therewith.

A further object of the present invention is to provide a semiconductor memory device where a sense amplifier can be arranged at the end of the bit line, i.e. in the proximity of the peripheral of the semiconductor chip.

The semiconductor memory device in accordance with the present invention comprises at least one pair of a first bit line pair formed by first and second bit lines, at least one pair of a second bit line pair formed by third and fourth bit lines provided corresponding to the first bit line pair, a plurality of memory cells, memory cell selecting means, read potential setting means, intermediate potential setting means, bit line connecting means, and a differential amplifying type sense amplifier.

Each of the plurality of memory cells is connected to one of the first to fourth bit lines. The memory cell selecting means selects one of the plurality of memory cells. The read potential setting means sets the potential of the bit line of the first to fourth bit lines belonging to the memory cell selected by the memory cell selecting means to a first or second read potential, in response to the set state of the selected memory cell. The intermediate potential setting means sets the potential of the fourth bit line when the memory cell belonging to the first bit line is selected, the potential of the third bit line when the memory cell belonging to the second bit line is selected, the potential of the second bit line when the memory cell belonging to the third bit line is selected, and the potential of the first bit line when the memory cell belonging to the fourth bit line is selected, respectively by the memory cell selecting means, to the intermediate potential between the first read potential and the second read potential. The bit line connecting means electrically connects the first and third bit lines, and the second and fourth bit lines, after the setting of the potential by the read potential setting means and the intermediate potential setting means. The differential amplifying type sense amplifier senses and amplifies the difference between the potential of the first and third bit lines connected by the bit line connecting means, and the potential of the second and fourth bit lines connected by the bit line connecting means.

In the semiconductor memory device according to the present invention, the bit line pair formed by two adjacent bit lines are divided into a first bit line pair and a second bit line pair. When a memory cell belonging to a bit line of either the corresponding first or second bit line pairs is selected, the potential of that bit line is set to a first or a second read potential depending on the set up contents of the selected memory cell. The potential of the bit line corresponding to the unselected side bit line of the bit line pair that differs from the bit line pair to which the selected memory cell belongs is set to the intermediate potential of the first and second read potentials. Then the first and second bit line pairs are electrically connected to be integrated into one bit line pair. The potential difference of the two bit lines forming the integrated bit lines pair is amplified by the sense amplifier. As a result, information read out from the selected memory cell is sensed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 11:
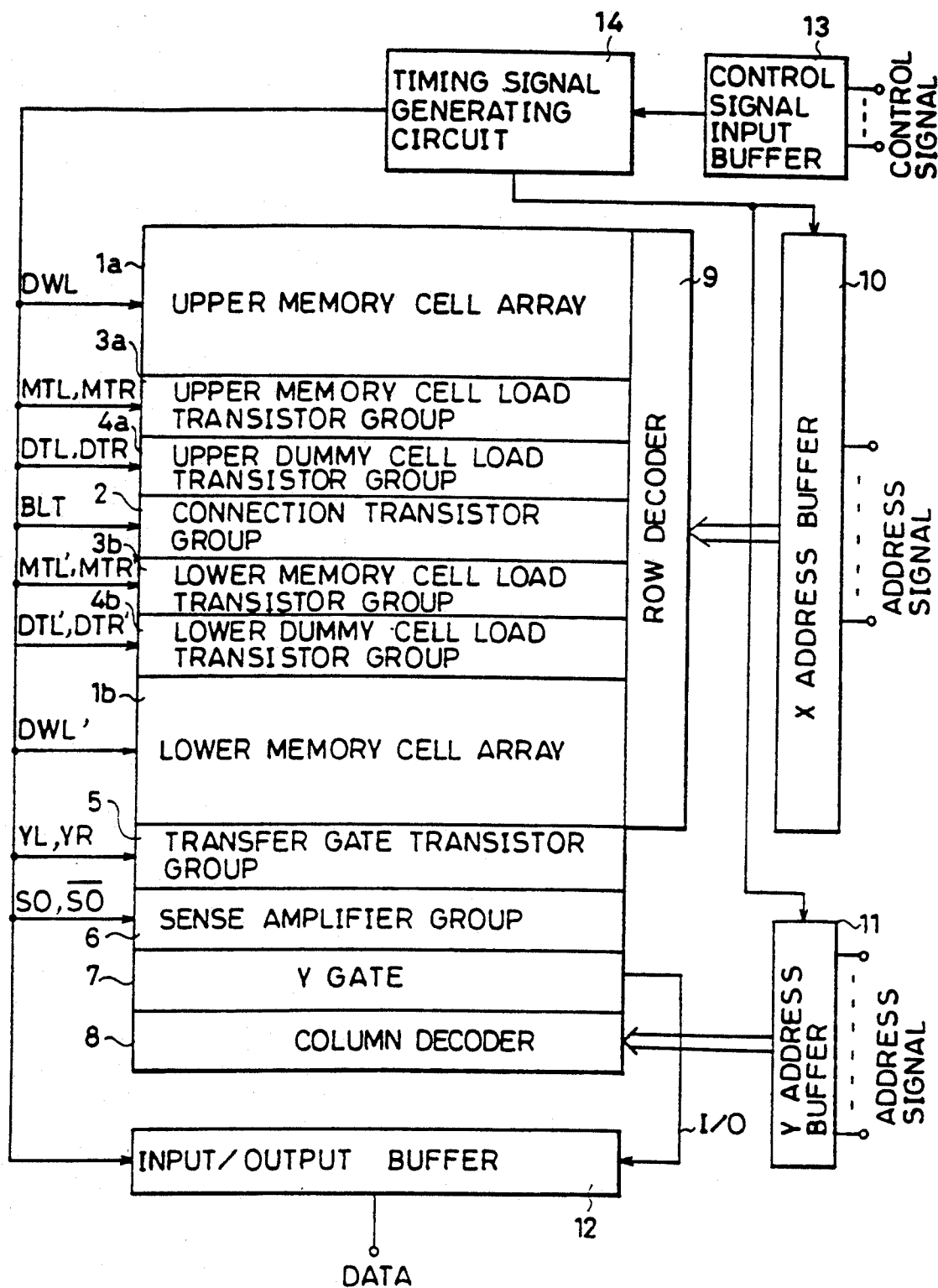
FIG. 11 is a schematic block diagram showing the structure of one embodiment of the present invention.

FIG. 11 is a block diagram showing the complete structure of a flash EEPROM in accordance with one embodiment of the present invention. Referring to FIG. 11, one memory cell array is divided into an upper memory cell array 1a and a lower memory cell array 1b. Between upper memory cell array 1a and lower memory cell array 1b, an upper memory cell load transistor group 3a, an upper dummy cell load transistor group 4a, a connection transistor group 2, a lower memory cell load transistor group 3b, and a lower dummy cell load transistor group 4b are arranged. A transfer gate transistor group 5 is arranged between lower memory cell 1b and sense amplifier group 6. A Y gate 7 is connected to sense amplifier group 6. A row decoder 9 and a column decoder 8 are provided for the purpose of selecting one memory cell out of the plurality of memory cells included in upper memory cell array 1a and lower memory cell array 1b. An external row address signal is applied to row decoder 9 via an X address buffer 10. An external column address signal is applied to column decoder 8 via a Y address buffer 11. Y gate 7 is connected to an input/output buffer 12 via input/output line I/O. An external control signal is supplied to a timing signal generating circuit 14 via a control signal input buffer 13. The timing signal generating circuit 14 generates various timing signals according to the control signal. The timing signals are applied to upper and lower memory cell arrays 1a and 1b, upper and lower memory cell load transistor groups 3a and 3b, upper and lower dummy cell load transistor groups 4a and 4b, connection transistor group 2, transfer gate transistor group 5, sense amplifier group 6, input/output buffer 12, X address buffer 10, and Y address buffer 11. Accordingly, the operation of the flash EEPROM of FIG. 11 is controlled in response to the timing signal from timing signal generating circuit 14.

Figure 1:
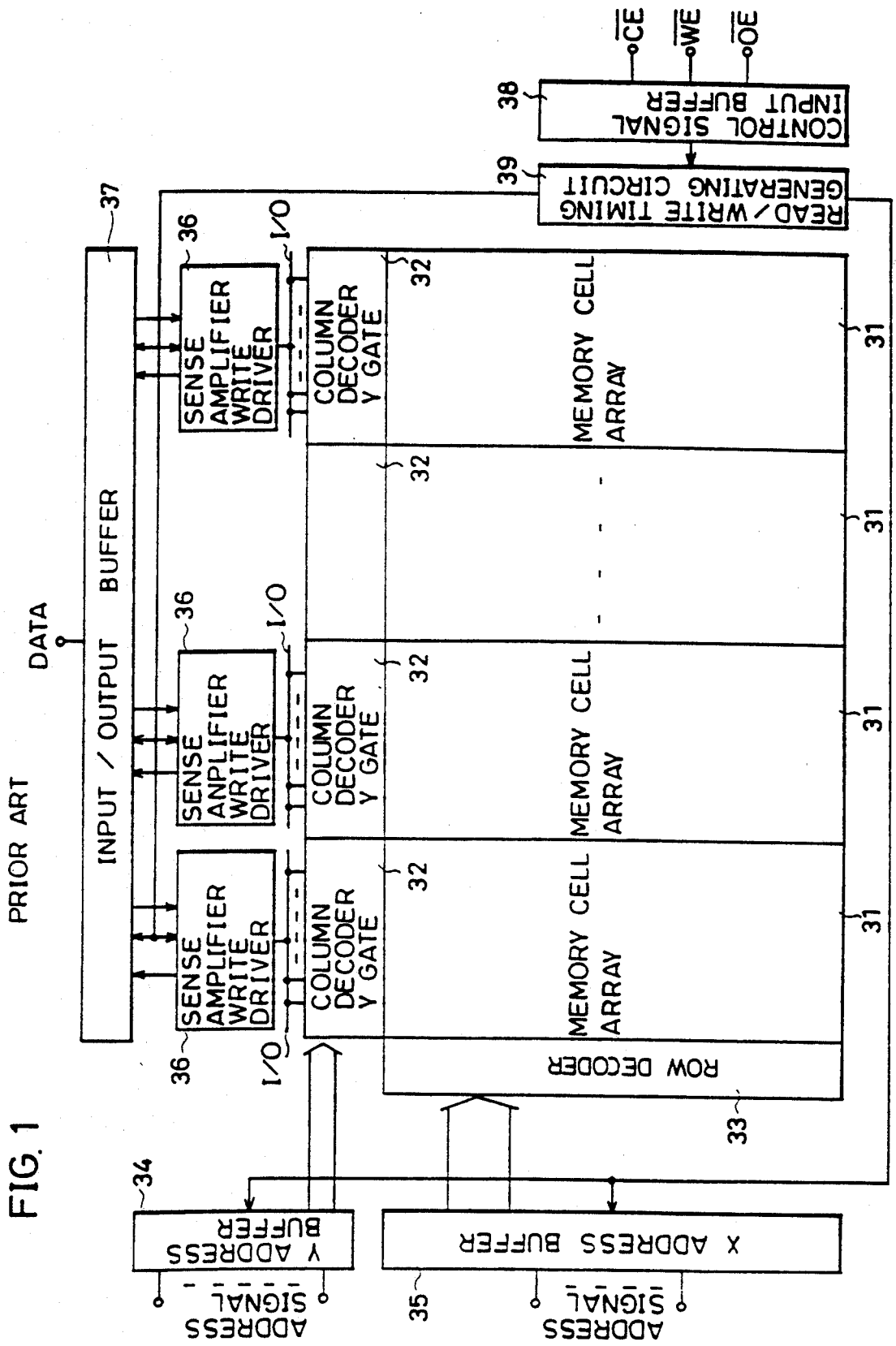
FIG. 1 is a block diagram showing the structure of a conventional flash EEPROM.
Figure 2:
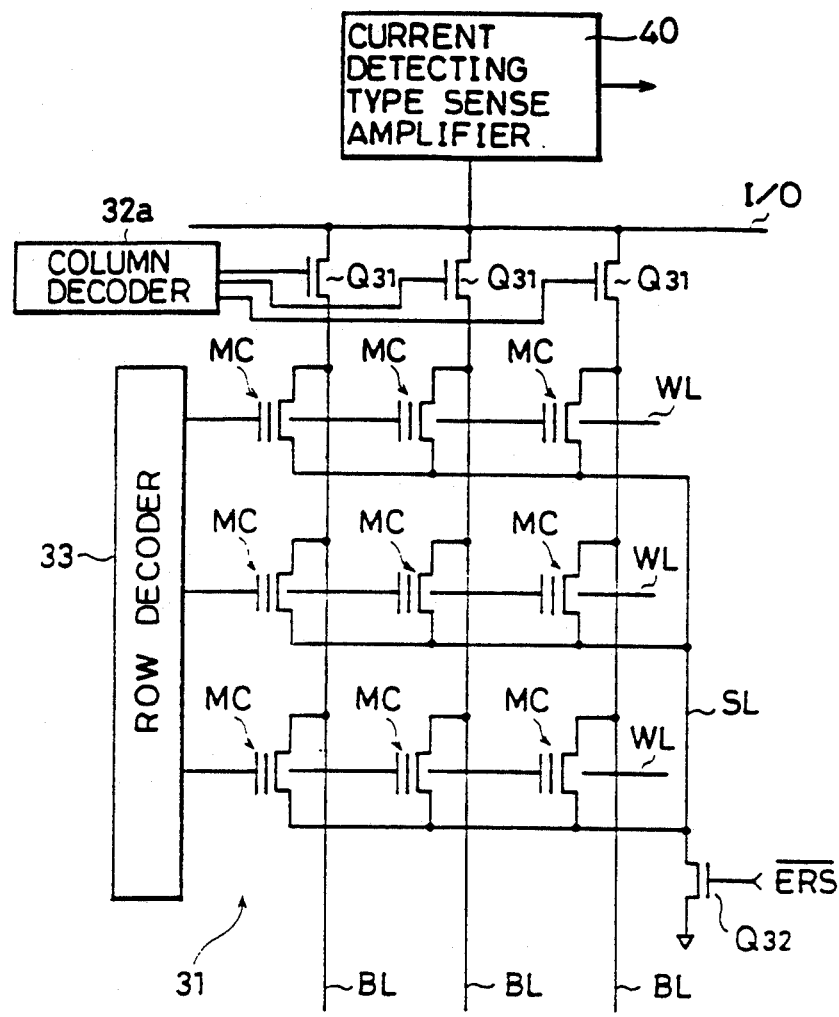
FIG. 2 ia a diagram showing the circuit structure of the memory cell array of FIG. 1.
Figure 3:
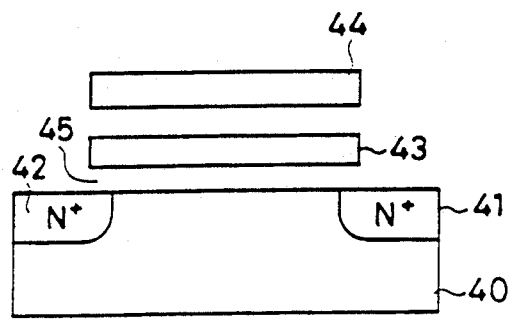
FIG. 3 is a sectional view of a memory cell.
Figure 4:
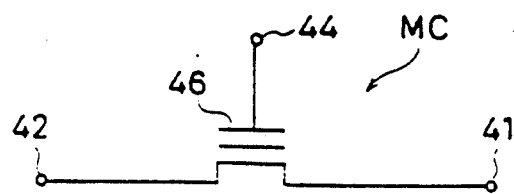
FIG. 4 is a diagram of an equivalent circuit of the memory cell of FIG. 3.
Figure 5:
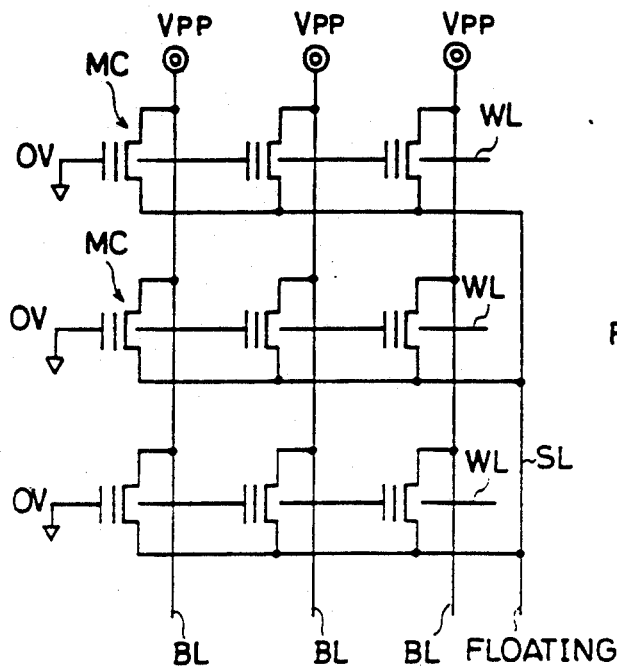
FIG. 5 is a diagram for explaining the erase operation of the flash EEPROM of FIG. 2.
Figure 6:
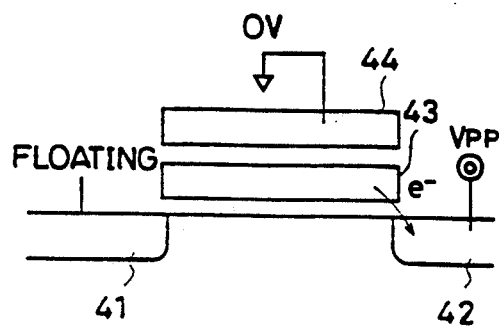
FIG. 6 is a sectional view for explaining the erase operation of the memory transistor.
Figure 7:
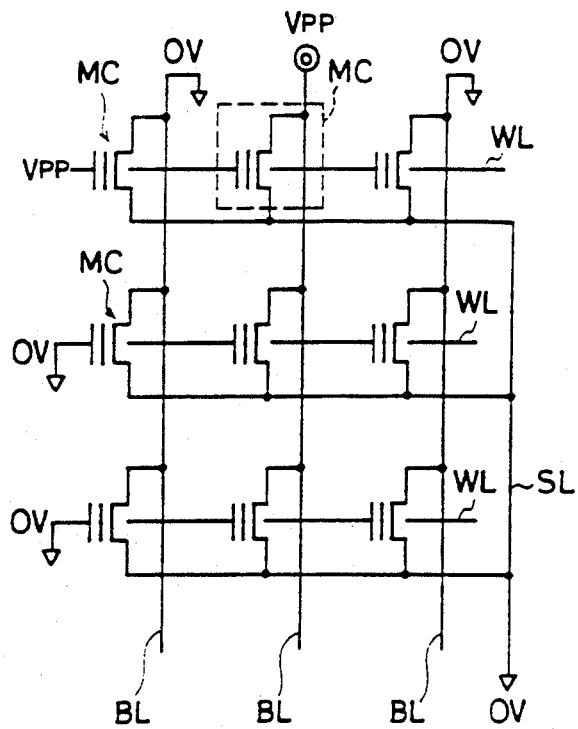
FIG. 7 is a diagram for explaining the write operation of the flash EEPROM of FIG. 2.
Figure 8:
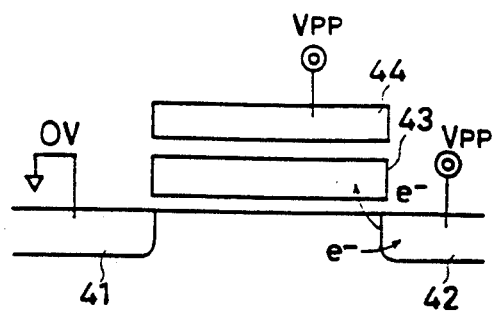
FIG. 8 is a sectional view for explaining the write operation of the memory transistor.
Figure 9:
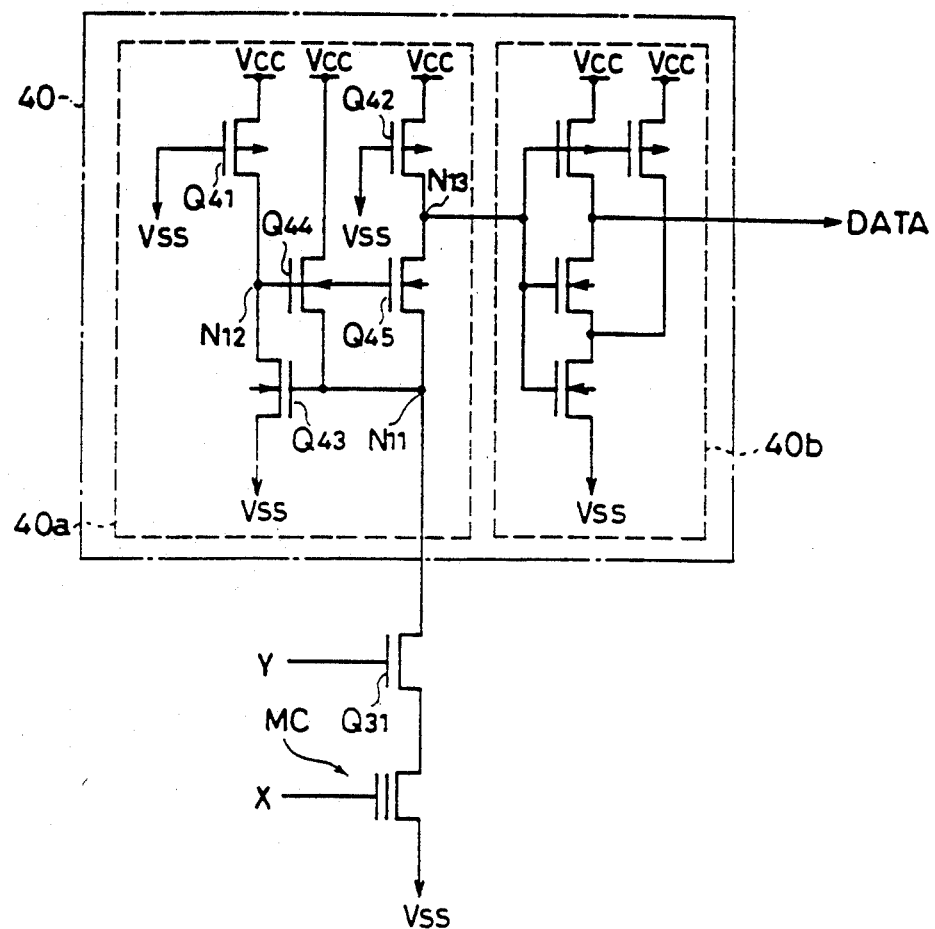
FIG. 9 is a diagram showing the circuit structure of a current detecting type sense amplifier.
Figure 10A:
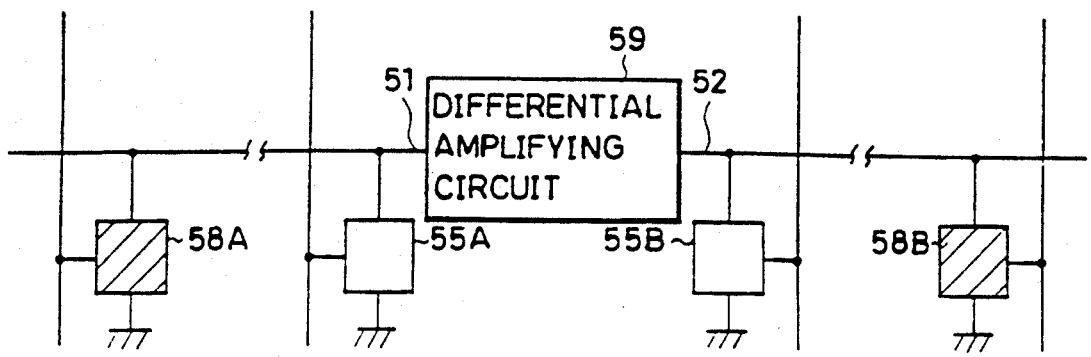
FIG. 10A is a diagram showing another example of a conventional semiconductor memory device.
Figure 10B:
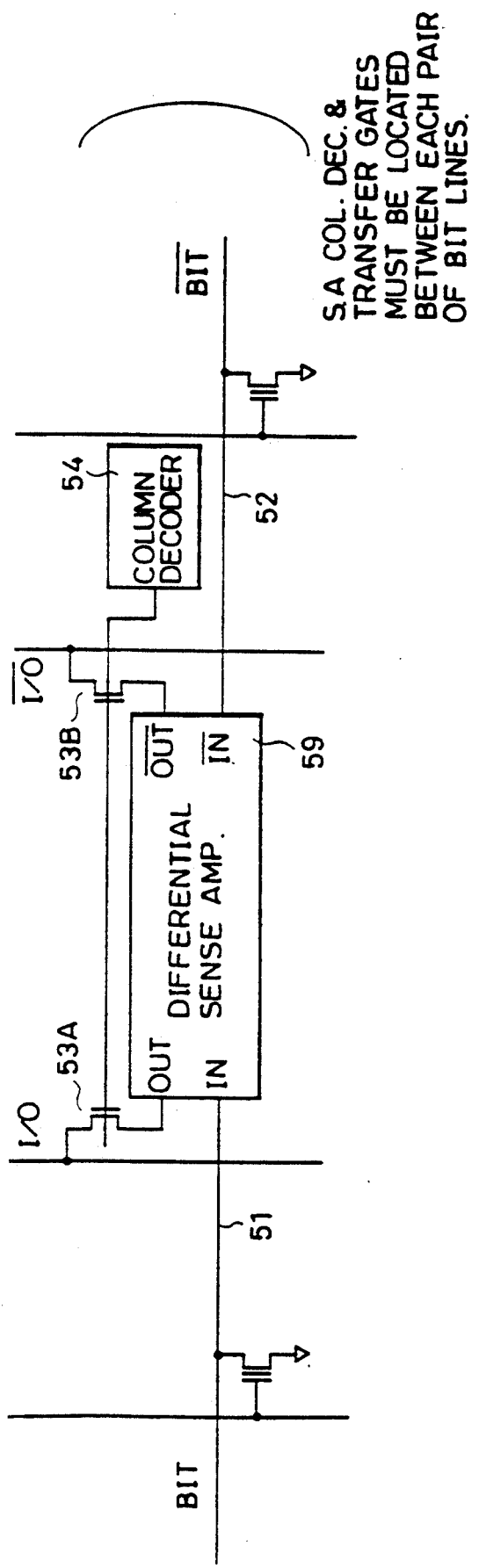
FIG. 10B shows a detail structure of the conventional semiconductor memory device of FIG. 10A.
Figure 12:
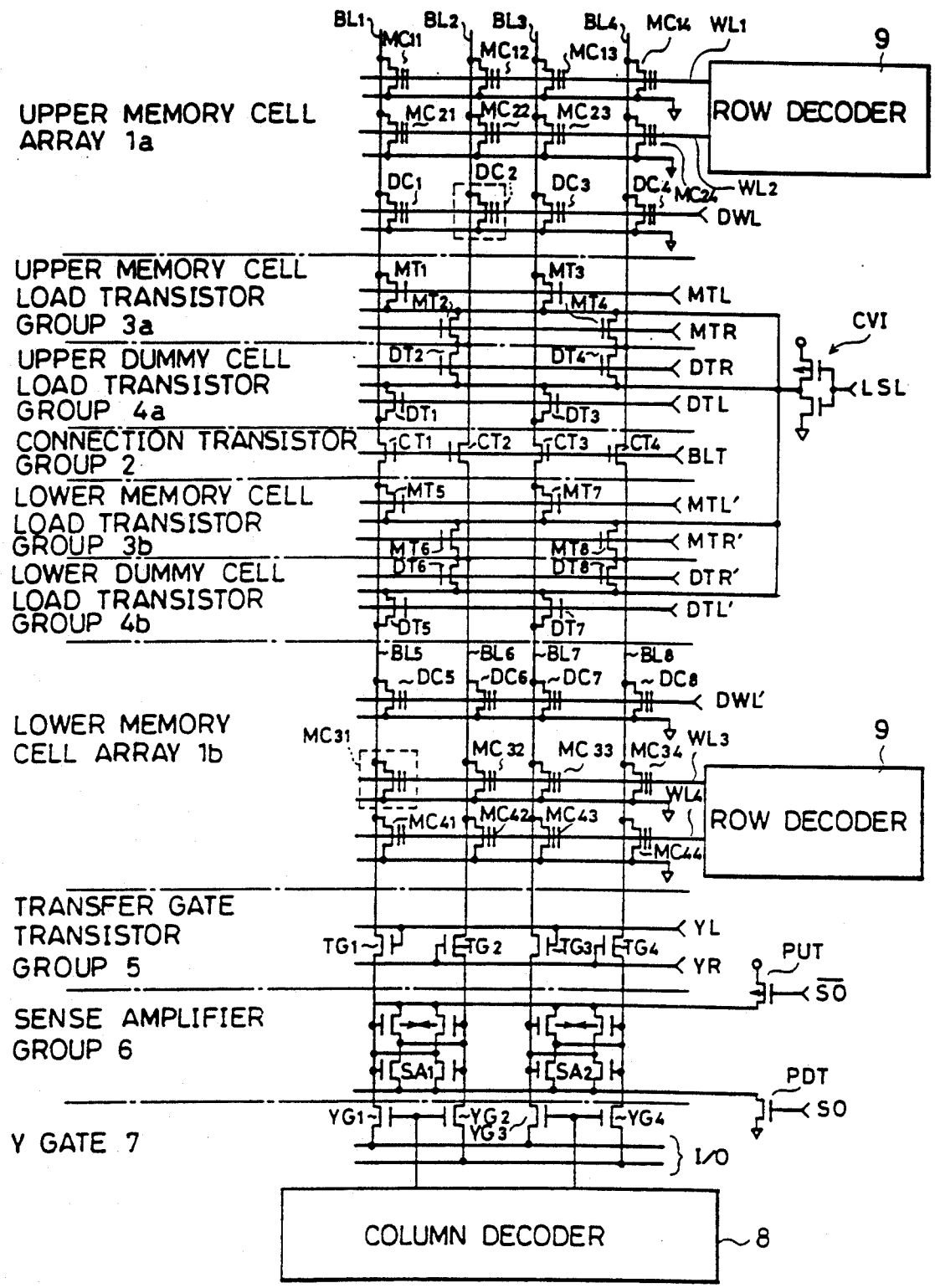
FIG. 12 is a circuit diagram showing the structure of the element of the embodiment of FIG. 11.

FIG. 12 is a circuit diagram showing the circuit structure of the element of the EEPROM shown in FIG. 11. Although the upper memory cell array 1a and the lower memory cell array 1b are one memory cell array essentially, they are divided into an upper memory cell array and a lower memory cell array by connection transistor group 2. Therefore, the bit lines BL1–BL4 provided in the upper memory cell array 1a, and the bit lines BL5–BL8 provided in the lower memory cell array 1b correspond to each other. The upper memory cell array 1a is provided with word lines WL1 and WL2. At each intersection of bit lines BL1–BL4 and word lines WL1 and WL2, memory cells MC11, MC12, . . . MC24 are disposed. Each memory cell has a structure similar to that of the memory cells shown in FIGS. 3 and 4. The drain of each memory cell is connected to a corresponding bit line, while each source is commonly connected and grounded at the time of reading. The control gate of each memory cell is connected to a corresponding word line. The lower memory cell array 1b is similarly provided with word lines WL3 and WL4, with memory cells MC31, MC32 . . . MC44 disposed at each intersection of word lines WL3 and WL4 and bit lines BL5–BL8. The connecting relationship of each memory cell is similar to that of each memory cell in the upper memory cell array 1a. Each of bit lines BL1–BL4 of the upper memory cell array 1a is provided with a dummy cell DC1–DC4, respectively. Similarly, each of bit lines BL5–BL8 of the lower memory cell array 1b is provided with one of the dummy cells DC5–DC8. Each of the dummy cells DC1–DC8 has a structure similar to that of the above mentioned memory cell. That is to say, memory cells and dummy cells are manufactured by identical processing steps, so that there is no diversification in the characteristics between the memory cell and the dummy cell. The drain of each of dummy cells DC1–DC8 is connected to a corresponding bit line. The source of each of dummy cells DC1–DC8 is commonly connected and grounded at the time of reading. The control gate of each of dummy cells DC1–DC4 in the upper memory cell array 1a is supplied with a timing signal DWL from timing signal generating circuit 14. The control gate of each of dummy cells DC5–DC8 in the lower memory cell array 1b is supplied with a timing signal DWL' from timing signal generating circuit 14. The row decoder 9 selects one of the word lines WL1, WL2, WL3, and WL4 in response to an address signal applied via X address buffer 10, to which a potential of the "H" level is applied.

The connection transistor group 2 comprises four connection transistors CT1–CT4 formed by N channel MOS transistors. The connection transistor CT1 is interposed between bit lines BL1 and BL5. The connection transistor CT2 is interposed between bit lines BL2 and BL6. The connection transistor CT3 is interposed between bit lines BL3 and BL7. The connection transistor CT4 is interposed between bit lines BL4 and BL8. The gate of connection transistors CT8–CT4 is supplied with a timing signal BLT from timing signal generating circuit 14. That is to say, the connection transistor group 2 controls the connection and blocking between the corresponding bit lines.

The upper memory cell load transistor group 3a comprises four upper memory cell load transistors MT1–MT4 formed by N channel MOS transistors. Similarly, the lower memory cell load transistor group 3b comprises four lower memory cell load transistors MT5–MT8 formed by N channel MOS transistors. One conductive terminal of each of the upper memory cell load transistors MT1–MT4 is connected to bit lines BL1–BL4, respectively. One conductive terminal of each of the lower memory cell load transistors MT5–MT8 is connected to bit lines BL5–BL8, respectively. The other conductive terminal of each of upper memory cell load transistors MT1–MT4 and lower memory cell load transistors MT5–MT8 is supplied with the output of CMOS inverter CVI. This CMOS inverter CVI inverts the timing signal LSL from timing signal generating circuit 14 to provide the inverted output. The gate of each of upper memory cell load transistors MT1 and MT3 is supplied with a timing signal MTL from timing signal generating circuit 14. The gate of each of the upper memory cell load transistors MT2 and MT4 is supplied with a timing signal MTR from timing signal generating circuit 14. Each gate of the lower memory cell load transistors MT5 and MT7 is supplied with a timing signal MTL' from timing signal generating circuit 14. Each gate of the lower memory cell load transistors MT6 and MT8 is supplied with a timing signal MTR' from timing signal generating circuit 14. Each memory cell load transistors MT1–MT8 is constructed so that the current driving capability thereof is smaller than that of each of memory cells MC11–MC44. As a result, the ON resistance of each of memory cell load transistors MT1–MT8 is larger than that of each memory cells MC11–MC44.

The upper dummy cell load transistor group 4a comprises four upper dummy cell load transistors DT1–DT4 formed by N channel MOS transistors. Similarly, the lower dummy cell load transistor group 4b comprises four lower dummy cell load transistors DT5–DT8 formed by N channel MOS transistors. The dummy cell load transistors DT1–DT8 are provided corresponding to bit lines BL1–BL8, wherein one conductive terminal of each dummy cell load transistor is connected to the corresponding bit line. The other conductive terminal of each of dummy cell load transistors DT1–DT8 is supplied with the output signal of CMOS inverter CVI. The gate of each of upper dummy cell load transistors DT1 and DT3 is supplied with a timing signal DTL from timing signal generating circuit 14. The gate of each of the upper dummy cell load transistors DT2 and DT4 is supplied with a timing signal DTR from timing signal generating circuit 14. The gate of each of the lower dummy cell load transistors DT5 and DT7 is supplied with a timing signal DTL' from timing signal generating circuit 14. The gate of each of the lower dummy cell load transistors DT6 and DT8 is supplied with a timing signal DTR' from timing signal generating circuit 14. Each of dummy cell load transistors DT1–DT8 is constructed so that the current driving capability thereof is larger than that of each of memory cell load transistors MT1–MT8. Accordingly, the ON resistance of each of dummy cell load transistors DT1–DT8 is smaller than that of each of memory cell load transistors MT1–MT8.

The transfer gate transistor group 5 comprises four transfer gate transistors TG1–TG4 formed by N channel MOS transistors. The transfer gate transistor TG1 is interposed between bit line BL5 and one node of differential amplifying type sense amplifier SA1. The transfer gate transistor TG2 is interposed between bit line BL6 and the other node of differential amplifying type sense amplifier SA1. The transfer gate transistor TG3 is interposed between bit line BL7 and one node of differential amplifying type sense amplifier SA2. The transfer gate transistor TG4 is interposed between bit line BL8 and the other node of differential amplifying type sense amplifier SA2. The gate of each of transfer gate transistors TG1 and TG3 is supplied with a timing signal YL from timing signal generating circuit 14. The gate of each of transfer gate transistors TG2 and TG4 is supplied with a timing signal YR from timing signal generating circuit 14.

The differential amplifying type sense amplifiers SA1 and SA2 are provided for every two adjacent bit lines, as shown in the figure. That is to say, the bit line pair is formed by two adjacent bit lines, wherein the potential difference of the two bit lines in each bit line pair is amplified by the corresponding differential amplifying type sense amplifier in the present embodiment. Each of differential amplifying type sense amplifiers SA1 and SA2 is supplied with activation signals $\overline{SO}$, SO from timing signal generating circuit 14 via a pull-up transistor PUT and a pull-down transistor PDT.

Y gate 7 comprises four gate transistors YG1–YG4 formed by N channel MOS transistors. The gate transistors YG1 and YG2 are interposed between one and the other nodes of differential amplifying type sense amplifier SA1 and input/output line I/O. The gate transistors YG3 and YG4 are interposed between one and the other nodes of differential amplifying type sense amplifier SA2 and input/output line I/O. The output of column decoder 8 is applied to the gate of each of gate transistors YG1–YG4. Column decoder 8 selects gate transistors YG1 and YG2, or YG3 and YG4, so that either of the outputs of differential amplifying type sense amplifiers SA1 and SA2 is provided to input/output line I/O.

Although FIG. 12 shows the upper and lower memory cell arrays 1a and 1b comprising two bit line pairs, more bit line pairs may be further provided.

Figure 13:
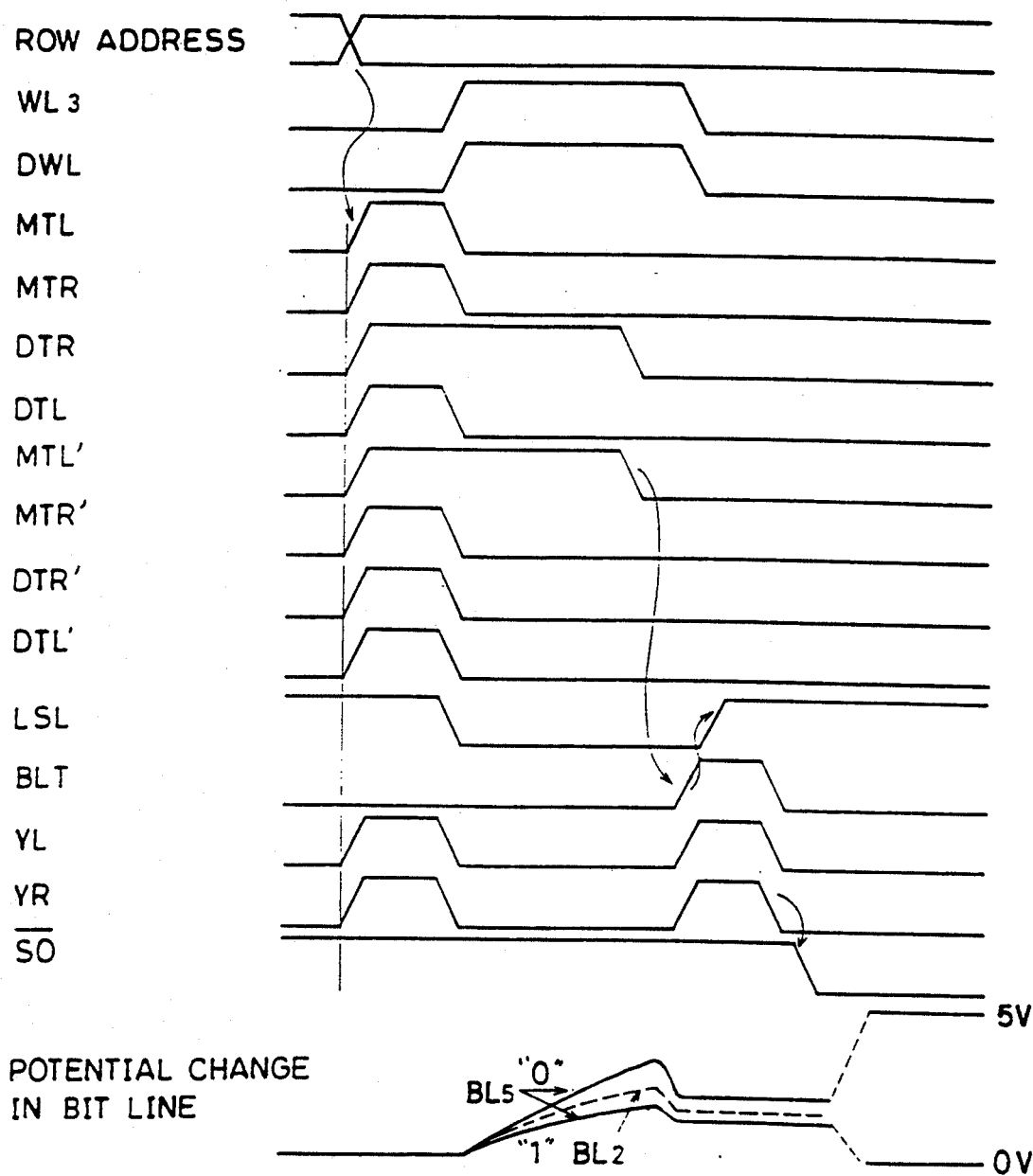
FIG. 13 is a timing chart for explaining the operation of the embodiment shown in FIGS. 11 and 12.

The operation of the embodiment of FIGS. 11 and 12 will be described. The read out operation featuring the present invention is first explained, where memory cell MC 31 enclosed with the dotted line in FIG. 12 is selected and information read out therefrom, as an example. Although the sense operation with respect to memory cell MC33 is carried out simultaneously at this time, the operation of the memory cell MC 31 will be explained for simplicity. The timing chart of each timing signal is shown in FIG. 13. Therefore, the operation will be described in reference to FIG. 13.

When the row address signal applied to X address buffer 10 changes, the timing signals MTL, MTR, DTR, DTL, MTL', MTR', DTR', and DTL' turn to the "H" level. This causes the upper memory cell load transistors MT1–MT4, the upper dummy cell load transistors DT1–DT4, the lower memory cell load transistors MT5–MT8, and the lower dummy cell load transistors DT5–DT8 to enter the conductive state. Timing signal LSL is at the "H" level, while the output of CMOS inverter CVI is at the "L" level. This "L" level signal is applied to bit lines BL1–BL8 via each of load transistors MT1–MT8, DT1–DT. Accordingly, the potential of each of bit lines BL1–BL8 is at the "L" level. Because timing signal BLT is at the "L" level at this time, each of connection transistors ST1–ST4 does not conduct. This means that bit lines BL1–BL4 and bit lines BL5–BL8 are electrically disconnected. Also, because timing signals YL and YR turn to the "H" level in response to the change of the row address signal, each of transfer gate transistors TG1–TG4 is conductive so that the potential of bit lines BL5–BL8 is transmitted to the node of each of the differential amplifying type sense amplifiers SA1, SA2. Since the potential of each of bit lines BL5–BL8 is at the "L" level, the nodes of each side of the differential amplifying type sense amplifiers SA1–SA2 are reset to the "L" level.

Then, timing signals MTL, MTR, DTL, MTR', DTR', DTL' turn to the "L" level. This causes all the load transistors excluding the lower memory cell load transistors MT5 and the upper dummy cell load transistor DT5 to be at the non-conductive state. In other words, the lower memory cell load transistor MT5 corresponding to the selected memory cell MC31 and the upper dummy cell load transistor DT2 corresponding to the dummy cell DC2 maintain the conductive state. Because timing signal LSL is also turned to the "L" level simultaneously at this time, the output of CMOS inverter CVI is brought to the "H" level. This "H" level signal is transmitted to bit lines BL5 and BL2 via the lower memory cell load transistor MT5 and the upper dummy cell transistor DT2. Consequently, the potentials of bit lines BL5 and BL2 rise. The potentials of the other bit lines BL1, BL6 are at the "L" level. Timing signals YL and YR also turn to the "L" level at this time, bringing transfer gate transistors TG1–TG4 to a non-conductive state. Therefore, bit lines BL5–BL8 and the differential amplifying type sense amplifiers SA1 and SA2 are disconnected.

Furthermore, timing signal DWL turns to the "H" level at this time. Dummy cells DC1–DC8 are previously set to the low state of the threshold. Accordingly, the dummy cells DC1–DC4 are brought to a conductive state in response to the timing signal TWL turning to the "H" level. Word line WL3 is selected by row decoder 9 at this time, to which a potential of the "H" level is applied. With word line WL3 being selected, memory cell MC31 becomes conductive or not conductive according to the set up contents.

Figure 14:
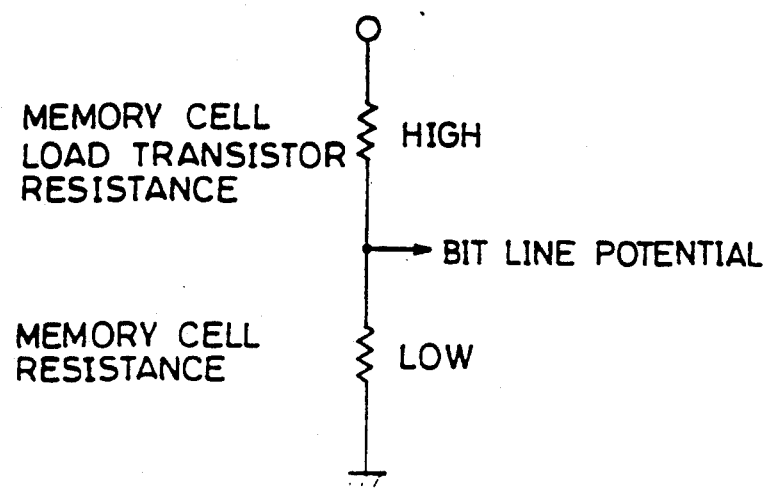
FIG. 14 is a circuit diagram showing a resistance dividing circuit formed by a memory cell and a memory cell load transistor at the time of data read out in the embodiment of FIG. 12.
Figure 15:
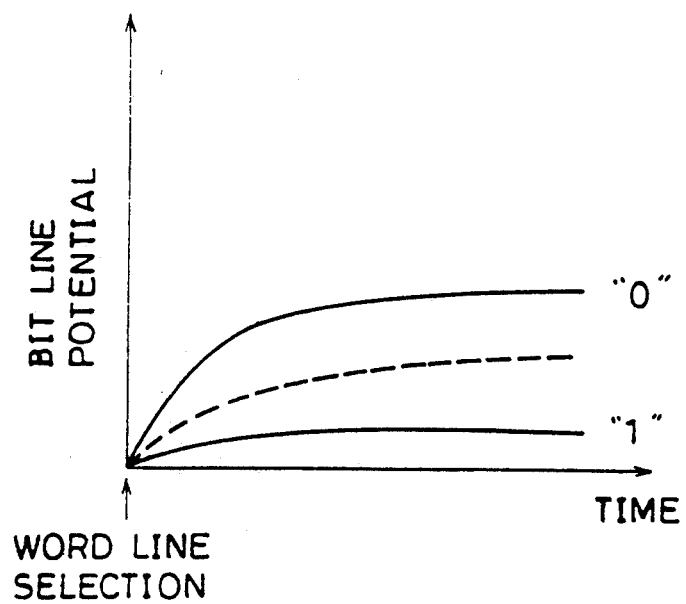
FIG. 15 is a graph showing the relation of the potentials set to each bit line in the embodiment of FIGS. 11 and 12.

If the selected memory cell MC31 is set to logic "1", i.e. to the low state of the threshold, memory cell MC31 becomes conductive. The corresponding lower memory cell load transistor MT5 also becomes conductive at this time. Therefore, a resistance dividing circuit as shown in FIG. 14 is implemented between the output terminal (the supply) of CMOS inverter CVI and ground. As mentioned before, memory cell load transistors MT1–MT8 are constructed so that the current driving capability thereof is smaller than that of each of memory cells MT11–MT44. This means that the ON resistance of the memory cell load transistor is larger than the ON resistance of the memory cell. Therefore, the potential of bit line BL5 hardly rises even when memory cell MC31 is turned to a conductive state, and the low value is maintained (refer to FIG. 15).

On the contrary, if the selected memory cell MC31 is set to logic "0", i.e. to a high state of the threshold, memory cell MC31 does not conduct even when word line WL3 is selected. Consequently, the potential of bit line BL5 gradually rises due to the "H" level output of CMOS inverter CVI (refer to FIG. 15).

It is understood that the current driving capability of each of dummy cell load transistors DT1-DT8 is set to be larger than that of each of memory cell load transistors MT1-MT8. This causes the ON-resistance of each of dummy cell load transistors to be smaller than that of each of memory cell load transistors. Therefore, when the upper dummy cell load transistor DT2 is conductive to form a resistance dividing circuit together with dummy cell DC2, the potential of bit line BL2 takes a potential that is intermediate the potentials of "0" read out and "1" read out in bit line BL5.

The other bit lines BL1 and BL6 are at a floating state maintaining "L" level, since the corresponding memory cell load transistors and dummy cell load transistors are all at a non-conductive state.

Then, timing signals DTR and MTL, are pulled down to the "L" level, in addition to the potentials of word line WL3 and timing signal DWL also pulled down to the "L" level. Accordingly, the upper dummy cell load transistor DT2, the lower memory cell load transistor MT5, dummy cells DC1-DC4, and memory cell MC31 are all turned to the non-conductive state. As a result, bit lines BL2 and BL5 are also turned to a floating state similar to other bit lines.

Then, timing signal BLT is turned to the "H" level, for bringing connection transistors CT1-CT4 to a conductive state. This causes bit lines BL1-BL4 and bit lines BL5-BL8 to be connected, respectively. Therefore, the potentials of bit lines BL1 and BL5, bit lines BL2 and BL6, bit lines BL3 and BL7, and bit lines BL4 and BL8 are respectively of equal potential. Furthermore, timing signals YL and YR are turned to the "H" level, and transfer gates TG1-TG4 are at a conductive state. The potentials of bit lines BL5 and BL6 are applied to the differential amplifying type sense amplifier SA1, while the potentials of bit lines BL7 and BL8 are applied to the differential amplifying type sense amplifier SA2. After timing signals YL and YR are pulled down to the "L" level, sense amplifier activation signal $\overline{SO}$ is turned to the "L" level, to activate differential amplifying type sense amplifiers SA1 and SA2. Therefore, the differential amplifying type sense amplifier SA1 amplifies the potential difference generated between bit lines BL5 and BL6.

Then column decoder 8 selects gate transistors YG1 and YG2 to transmit the output of differential amplifying type sense amplifier SA1 to input/output line I/O.

The operation of other selected memory cell is similar to the manner described above. In summary, the potential of the bit line belonging to the selected memory cell of the four bit lines included in the divided two bit line pairs is set to the read potential, while the potential of the bit line of the unselected side in the bit line pair opposite the bit line pair to which the bit line belongs is set to the intermediate potential. Thereafter, both bit line pairs are connected so that the potential difference thereof may be amplified by the sense amplifier.

The writing operation in the embodiment of FIGS. 11 and 12 will be explained hereinafter. The operation of writing information into memory cell MC 31 is explained as an example.

Sense amplifier activation signal SO is brought to a L level and $\overline{SO}$ to a H level to inactivate sense amplifiers SA1 and SA2. Column decoder 8 applies a high voltage $V_{PP}$ to the gates of gate transistors YG1 and YG2 to turn on gate transistors YG1 and YG2. Timing signal generating circuit 14 brings the potential of timing signal YL to high voltage $V_{PP}$. If the write data to memory cell MC 31 is "0", write voltage (generally a voltage equal to or more than 5V and less than or equal to $V_{PP}$) is applied to input/output line I/O. This write voltage is applied to the drain of memory cell MC 31 via bit line BL5. Memory cell MC 31 has the source connected to ground at this time. Therefore, hot electrons are generated in memory cell MC 31 to carry out writing.

When writing to a memory cell connected to the upper portion bit lines BL1-BL4, the potential of timing signal BLT is also brought to high voltage $V_{PP}$. Accordingly, the write voltage applied to input/output line I/O is applied to the drain of the memory cell to be written via gate transistors YG1-YG4, lower portion bit lines BL5-BL8, transistors CT1-CT4 and upper portion bit lines BL1-BL4.

Next, the erase operation in the embodiment of FIGS. 11 and 12 will be explained hereinafter.

All word lines 9 are grounded by low decoder 9. This causes a voltage of 0V to be applied to the control gates of all memory cells. Next, timing signal generating circuit 14 brings the potentials of timing signals YL and YR to 0V. This turns off transfer gate transistors TG1-TG4 to render all bit lines to a floating state. A high voltage is applied to the sources of all memory cells. This causes the electrons stored in the floating gates of each memory cell to be drawn to the source by tunnel phenomenon to lower the threshold voltage of each memory cell. Thus, data stored in all memory cells are erased at one time.

Although each of bit lines BL1-BL8 is reset through memory cell load transistors and dummy cell load transistors in the above described embodiment, it is possible to provide instead a transistor exclusively for resetting, and reset each bit line through this reset exclusive transistor.

A current mirror type sense amplifier may be used instead of the flipflop type shown for the differential amplifying type sense amplifier in the above described embodiment.

Although dummy cells and the dummy cell load transistors are used to set up an intermediate potential in the bit line in the above described embodiment, an external intermediate potential may be directly applied to the corresponding bit line instead. It is also possible to keep the ON resistances of the dummy cell load transistor and the memory cell load transistor the same while establishing a larger ON resistance of the dummy cell than that of the memory cell, and set an intermediate potential to the bit line.

Figure 16:
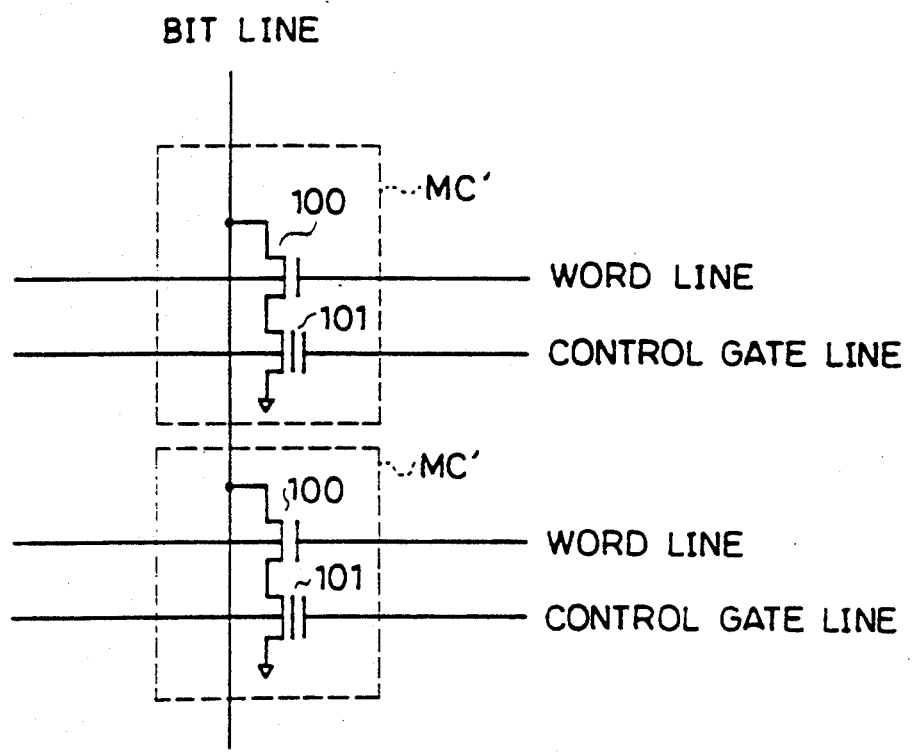
FIG. 16 is a circuit diagram of a structure of another EEPROM memory cell applicable for the present invention.

Although the above embodiments are described in which a flash EEPROM is employed, the present invention may be applied to other EEPROMs, for example full-featured EEPROMs. With a full-featured EEPROM, each memory cell MC' is constituted by a select transistor 100 and a memory transistor 101, as shown in FIG. 16, where erasing and writing operation are both carried out by tunnel phenomenon. Read out operation is similar to that of the embodiments of FIGS. 11 and 12, where carried by deducting whether current flows through the selected memory cell MC'. The circuit configuration of the whole device is similar to that in the embodiment of FIGS. 11 and 12, providing that memory cell MC of FIG. 12 is replaced by the memory cell MC' of FIG. 16.

Thus, in accordance with the present invention, it is possible to sense the read out data using a differential amplifying type sense amplifier, by providing a bit line pair from two adjacent bit lines so that a read potential is set to one bit line and an intermediate potential is set to the other bit line. As a result, the layout area of the sense amplifier may be reduced in comparison with the current detecting type sense amplifier used in conventional flash EEPROM and sense the read out data for each bit line. Accordingly, a high speed page mode readout may be implemented.

It is also possible to arrange each sense amplifier at one end of the bit lines, by dividing each bit line pair into two, to set a read potential to one bit line pair and an intermediate potential to the other bit line pair, followed by connecting both bit line pairs to be coupled to the sense amplifier. As a result, the layout of the wiring of the data input/output lines will be simplified with the length of the wiring also shortened.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device reading out information by differential amplification, comprising:
   a first pair of bit lines formed by first and second bit lines,
   a second pair of bit lines formed by third and fourth bit lines provided in correspondence to said first bit line pair,
   a plurality of memory cells each connected to one of said first to forth bit lines and respectively set to one of first and second states,
   memory cell selecting means for selecting one of said plurality of memory cells,
   read potential setting means for setting the potential of the bit line of said first to fourth bit lines belonging to the memory cell selected by said memory cell selecting means to a first or second read potential in response to a set state of the selected memory cell,
   intermediate potential setting means for setting the potential of said fourth bit line when the memory cell belonging to said first bit line is selected, the potential of said third bit line when the memory cell belonging to said second bit line is selected, the potential of said second bit line when the memory cell belonging to said third bit line is selected, and the potential of said first bit line when the memory cell belonging to said fourth bit line is selected, by said memory cell selecting means, respectively to an intermediate potential between said first read potential and said second read potential,
   bit line connecting means for electrically connecting said first bit line to said third bit line, and said second bit line to said fourth bit line, after the setting of the potentials by said read potential setting means and said intermediate potential setting means, and
   at least one differential amplifying type sense amplifier for detecting and amplifying the differences between the potential of said first and third bit line connected by said bit line connecting means and the potential of said second and fourth bit lines connected by said bit line connecting means and the potential of said second and fourth bit lines connected by said bit line connecting means.

2. The semiconductor memory device according to claim 1, wherein said plurality of memory cells each comprise a non-volatile memory cell.

3. The semiconductor memory device according to claim 2, wherein said non-volatile memory cell comprises an EEPROM memory cell.

4. The semiconductor memory device according to claim 3, wherein said EEPROM memory cell is set to a state of either a first state becoming conductive when selected by said memory cell selecting means, and a second state becoming non-conductive when selected by said memory cell selecting means.

5. The semiconductor memory device according to claim 4, wherein said EEPROM memory cell comprises
   a control gate being supplied with the output of said memory cell selecting means,
   a drain coupled to a corresponding bit line of said first to fourth bit lines,
   a source coupled to a corresponding bit line of said first to fourth bit lines,
   a floating gate capable of storing charge.

6. The semiconductor memory device according to claim 5, wherein said read potential setting means comprises
   a first memory cell load transistor interposed between said first bit line and a second reference potential source,
   a second memory cell load transistor interposed between said second bit line and the second reference potential source,
   a third memory cell load transistor interposed between said third bit line and the second reference potential source,
   a fourth memory cell load transistor interposed between said fourth bit line and the second reference potential source, and
   memory cell load transistor driving means for selectively driving a memory cell load transistors belonging to the bit line of the memory cell selected by said memory cell selecting means.

7. The semiconductor memory device according to claim 6, wherein said EEPROM memory cell has a current driving capability larger than that of said first to fourth memory cell load transistors.

8. The semiconductor memory device according to claim 7, wherein said intermediate potential setting means comprises
   a first dummy cell interposed between said first bit line and the first reference potential source, having a structure similar to that of said EEPROM memory cell,
   a second dummy cell interposed between said second bit line and the first reference potential source, having a structure similar to that of said EEPROM memory cell,
   a third dummy cell interposed between said third bit line and the first reference potential source, having a structure similar to that of said EEPROM memory cell, a fourth dummy cell interposed between said fourth bit line and the first reference potential source, having a structure similar to that of said EEPROM memory cell, a first dummy cell load transistor interposed between said first bit line and the second reference potential source, a second dummy cell load transistor interposed between said second bit line and the second reference potential source, a third dummy cell load transistor interposed between said third bit line and the second reference potential source, a fourth dummy cell load transistor interposed between said fourth bit line and the second reference potential source, dummy cell selecting means for selecting a dummy cell of said first to fourth dummy cells belonging to the bit line setting said intermediate potential, and a dummy cell load transistor driving means for selectively driving the dummy cell load transistor of said first to forth dummy cell load transistors belonging to the bit line of dummy cell selected by said dummy cell selecting means, said first to fourth dummy cells being set to be conductive when selected by said dummy cell selecting means.

9. The semiconductor memory device according to claim 7, wherein said first to fourth dummy cells load transistors have a current driving capability larger than that of said first to fourth memory cells load transistors.

10. The semiconductor memory device according to claim 1, further comprising a plurality of word lines arranged to cross said first bit line and said second bit line, or said third bit line or said fourth bit line, connected to the corresponding memory cell of said plurality of memory cells, said memory cell selecting means selecting one of said plurality of word lines in response to an externally applied address signal.

11. The semiconductor memory device according to claim 1, wherein said bit line connecting means comprises a first gate means interposed between said first bit line and said third bit line, a second gate means interposed between said second bit line and said fourth bit line, and open/close control means for controlling the opening and closing of said first and second gate means.

12. The semiconductor memory device according to claim 1, further comprising a sense amplifier connecting means for electrically connecting the first and third bit lines to said sense amplifier, and electrically connecting the second and fourth bit line to said sense amplifier, in synchronism with said bit line connecting means connecting said first bit line and said third bit line, and connecting said second bit line and said third bit line.

13. The semiconductor memory device according claim 4, wherein said EEPROM memory cell comprises a select transistor selected in response to the output of said memory cell selecting means, and a memory cell transistor including a drain, a source, a control gate and a floating gate, said drain coupled to the corresponding bit line via said select transistor for holding information in the form of a charge in the floating gate.

14. A semiconductor memory device including:

a pair of bit lines divided into upper and lower portions comprising (i) a left bit line divided into said upper and lower portions and (ii) a right bit line divided into said upper and lower portions, upper and lower word lines respectively crossing said upper and lower portions of said bit lines, first through fourth memory cells and respectively storing data therein and connected to said upper portions of said left and right bit lines and said lower portions of said left and right bit lines, said first and second memory cell connected to receive an upper row selection signal from said upper word line and said third and fourth memory cells connected to receive a lower row selection signal from said lower word line, memory cell selecting means for selectively applying said upper and lower row selection signal for selecting one of said first through fourth memory cells, read potential setting means for setting a portion of said bit lines connected to said selected one of said memory cells to a high or low level in response to said data stored in said selected memory cell, intermediate potential setting means for setting a bit line portion diagonally opposite said bit line portion connected to said selected memory cell to a potential intermediate said high and low potentials whereby, in response to selection of said first memory cell said lower portion of said right bit line is set to said intermediate level, in response to selection of said second memory cell said lower portion of said left bit line is set to said intermediate level, in response to selection of said third memory cell said upper portion of said right bit line is set to said intermediate level, and in response to selection of said fourth memory cell said upper portion of said left bit line is set to said intermediate level, bit line connecting means for electrically connecting said upper portions of said left and right bit lines to said lower portion of said left and right bit lines, respectively, in response to said intermediate potential means setting said intermediate level, and differential sense amplifier means for detecting and amplifying a difference in said levels of said left and right bit lines.

15. A method of reading information from a semiconductor memory device including a pair of bit lines divided into upper and lower portions comprising (i) a left bit line divided into said upper and lower portions and (ii) a right bit line divided into said upper and lower portions, and first through fourth memory cells and respectively storing data therein and connected to said upper portions of said left and right bit lines and said lower portions of said left and right bit lines, said first and second memory cells connected to receive an upper row selection signal from said upper word line and said third and fourth memory cells connected to receive a lower row selection signal from said lower word line, said method comprising the steps of:

selecting one of said first through fourth memory cells, setting a portion of said bit lines connected to said selected one of said memory cells to a high or low level in response to said data stored in said selected memory cell, setting a bit line portion diagonally opposite said bit line portion connected to said selected memory cell to a potential intermediate said high and low potentials whereby, in response to selection of said first memory cell said lower portion of said right bit line is set to said intermediate level, in response to selection of said second memory cell said lower portion of said left bit line is set to said intermediate level, in response to selection of said third memory cell said upper portion of said right bit line is set to said intermediate level, and in response to selection of said fourth memory cell said upper portion of said left bit line is set to said intermediate level, electrically connecting, after said bit line portion setting step, said upper portions of said left and right bit lines to said lower portion of said left and right bit lines, respectively, and detecting and amplifying a difference in said levels of said left and right bit lines.

16. A nonvolatile semiconductor memory device, comprising:

a first memory cell array having a plurality of electrically erasable and programmable memory cells arranged in a matrix of a plurality of columns and a plurality of rows;

a second memory cell array having a plurality of electrically erasable and programmable memory cells arranged in a matrix of the same plurality of columns as said plurality of columns in said first memory cell array and the same plurality of rows as said plurality of rows in said first memory cell array;

each of the electrically erasable and programmable memory cells in the first and second memory cell arrays having a source electrode, a drain electrode, a floating gate and a control gate;

a plurality of first bit line pairs including a plurality of first bit lines, each of said first bit line pairs including adjacent two first bit lines, said plurality of first bit lines being arranged in the plurality of columns in said first memory cell array and each first bit line being connected to the drains of a plurality of memory cells arranged in corresponding column of said first memory cell array;

a plurality of second bit line pairs including a plurality of second bit lines, each of said second bit line pairs including adjacent two second bit lines, said plurality of second bit lines being arranged in the plurality of columns in said second memory cell array and each second bit line being connected to the drains of a plurality of memory cells arranged in corresponding column of said second memory cell array;

a plurality of first word lines arranged in the plurality of rows in said first memory cell array, each first word line being connected to the control gates of plurality of memory cells arranged in a corresponding row of said first memory cell array;

a plurality of second word lines arranged in the plurality of rows in said second memory cell array, each second word line being connected to the control gates of plurality of memory cells arranged in corresponding row of said second memory cell array;

selecting means for selecting a specified memory cell from said plurality memory cells in said first and second memory cell arrays;

a plurality of sense amplifiers provided corresponding to said plurality of second bit line pairs, each sense amplifier amplifying a potential difference appearing between the second bit lines of the corresponding second bit line pair;

a plurality of switching means arranged in plurality of columns and each connected between the first bit line arranged in a corresponding column and the second bit line arranged in a corresponding column for making said first bit lines and second bit lines electrically non-conductive before a sensing operation of said sense amplifiers and making said first bit lines and second bit lines electrically conductive when said sense amplifiers carry out the sensing operation; and comparing potential voltage setting means, operative when the specified memory cell is selected by said selecting means in the first memory cell array, after setting said plurality of first bit lines and plurality of second bit lines to a first potential and before said sense amplifiers conduct the sensing operation, for setting one second bit line of the second bit line pair together with another second bit line which corresponds to the first bit line connected to the selected memory cell, to a second potential intermediate a first read potential and a second read potential based on stored information in the memory cell, and operative when the specified memory cell is selected by said selecting means in the second memory cell array, for making one first bit line of the first bit line pair together with another first bit line which corresponds to the second bit line connected to the selected memory cell, attain said second potential.

17. A nonvolatile semiconductor memory device, comprising:

a first memory cell array having a plurality of electrically erasable and programmable memory cells arranged in a matrix of a plurality of columns and a plurality of rows;

a second memory cell array having a plurality of electrically erasable and programmable memory cells arranged in a matrix of the same plurality of columns as those in said first memory cell array and the same plurality of rows as those in said first memory cell array;

each of the electrically erasable and programmable memory cells of said first and second memory cell arrays having a source electrode, a drain electrode, a floating gate, and a control gate;

a plurality of first bit line pairs including plurality of first bit lines, each of the first bit line pairs including adjacent two first bit lines, said plurality of first bit lines being arranged in the plurality of columns in said first memory cell array and each first bit line being connected to the drains of a plurality of memory cells arranged in corresponding column of said first memory cell array;

a plurality of second bit line pairs including a plurality of second bit lines, each of said second bit line pairs including adjacent two second bit lines, said plurality of second bit lines being arranged in the plurality of columns in said second memory cell array and each second bit line being connected to the drains of a plurality of memory cells arranged in a corresponding column of said second memory cell array;

a plurality of first word lines arranged in said plurality of rows in said first memory cell array, each word line being connected to the control gates of a plurality of memory cells arranged in a corresponding row in said first memory cell array;

a plurality of second word lines arranged in the plurality of rows in said second memory cell array, each second word line being connected to the control gates of a plurality of memory cells arranged in a corresponding row in said second memory cell array;

a plurality of first dummy cells arranged in the plurality of columns in said first memory cell array, each first dummy cell having the same structure as that in the memory cell, the drain of the first dummy cell being connected to a corresponding first bit line;

a plurality of second dummy cells arranged in the plurality of columns in said second memory cell array, each second dummy cell having the same structure as that in the memory cell, the drain of the second dummy cell being connected to a corresponding second bit line;

a first dummy word line connected to the control gates of said plurality of first dummy cells;

a second dummy word line connected to the control gates of said plurality of second dummy cells;

a plurality of first memory cell load transistors provided corresponding to said plurality of first bit lines, each of the first load transistors being connected between the corresponding first bit line and a potential supplying node and having a current driving capability lower than that of said memory cell, the plurality of first memory cell load transistors being connected to one of the first bit lines included in said first bit line pair controlled for conduction/non-conduction in response to a first control signal and the plurality of first memory cell load transistors being connected to other of the first bit lines included in said first bit line pair controlled for conduction/non-conduction in response to a second control signal;

a plurality of second memory cell load transistors provided corresponding to said plurality of second bit lines, each of the second memory cell load transistors being connected between a corresponding second bit line and said potential supplying node and having the same current driving capability as that of said first memory cell load transistor, the plurality of second memory cell load transistors being connected to one second bit line of a second bit line pair controlled for conduction/non-conduction in response to a third control signal, and the plurality of second memory cell load transistors being connected to another second bit line of the second bit line pair controlled for conduction/non-conduction in response to a fourth control signal;

a plurality of first dummy cell load transistors provided corresponding to said plurality of first bit lines and each connected between the corresponding first bit line and said potential supplying node and having current driving capability higher than that of said memory cell load transistors, the plurality of first dummy cell load transistors being connected to one first bit line of a first bit line pair controlled for conduction/non-conduction in response to a fifth control signal and the plurality of first dummy cell load transistors being connected to another first bit line of the first bit line pair controlled for conduction/non-conduction in response to a sixth control signal;

a plurality of second dummy cell load transistors provided corresponding to said plurality of second bit lines and each connected between a corresponding second bit line and said potential supplying node and having the same current driving capability as that of said first memory cell load transistors, the plurality of second dummy cell load transistors being connected to one second bit line of a second bit line pair controlled for conduction/non-conduction in response to a seventh control signal and the plurality of second dummy cell load transistors being connected to another second bit line of the second bit line pair controlled for conduction/non-conduction in response to an eighth control signal;

a plurality of sense amplifiers provided corresponding to said plurality of second bit line pairs, each of the same amplifiers amplifying a potential difference appearing between second bit lines of a corresponding second bit line pair; and a plurality of switching means arranged in a plurality of columns, each of the plurality of switching means being connected between a first bit line arranged in a corresponding column and a second bit line arranged in a corresponding column, for making said first bit line and said second bit line electrically non-conductive before sense operation of said sense amplifiers and for making the first bit line and the second bit line electrically conductive when the sense amplifiers conduct sense operation.

18. A nonvolatile semiconductor memory device, recited in claim 17, wherein
said plurality of switching means, said plurality of first and second memory cell load transistors, and said plurality of said first and second dummy cell load transistors are arranged between said first memory cell array and said second memory cell array.

19. A nonvolatile semiconductor memory device recited in claim 18, wherein
said sense amplifiers are disposed on a side of said second memory cell array opposite the first memory cell array.

20. A nonvolatile semiconductor memory device recited in claim 17, wherein
each of the sense amplifiers is connected to a corresponding second bit line pair through a transfer gate which is controlled for conduction/non-conduction in response to a ninth control signal.

* * * * *